United States Patent [19]

Yamanaka

[11] Patent Number: 4,883,777

[45] Date of Patent: Nov. 28, 1989

[54] SEALING GLASS COMPOSITION WITH FILLER CONTAINING FE AND W PARTIALLY SUBSTITUTED FOR TI IN PBTIO₃ FILLER

[75] Inventor: Toshio Yamanaka, Shiga, Japan

[73] Assignee: Nippon Electric Glass Company, Limited, Shiga, Japan

[21] Appl. No.: 333,450

[22] Filed: Apr. 5, 1989

[30] Foreign Application Priority Data

Apr. 7, 1988 [JP] Japan ................................. 63-86909

[51] Int. Cl.⁴ .............................................. C03C 3/12
[52] U.S. Cl. ....................................... 501/15; 501/17; 501/32
[58] Field of Search .............................. 501/15, 17, 32

[56] References Cited

U.S. PATENT DOCUMENTS

| | | | |
|---|---|---|---|
| 4,405,722 | 9/1983 | Kokuba et al. | 501/15 |
| 4,522,925 | 6/1985 | Pirooz | 501/15 |
| 4,537,863 | 8/1985 | Matsuura et al. | 501/15 |
| 4,621,064 | 11/1986 | Matsuura et al. | 501/15 |
| 4,704,370 | 11/1987 | Seki et al. | 501/15 |
| 4,710,479 | 12/1987 | Yamanaka et al. | 501/15 |
| 4,774,208 | 9/1988 | Yamanaka et al. | 501/15 |

FOREIGN PATENT DOCUMENTS

| | | | |
|---|---|---|---|
| 3002353 | 7/1980 | Fed. Rep. of Germany | 501/15 |
| 59-164649 | 9/1984 | Japan | 501/15 |

*Primary Examiner*—Mark L. Bell
*Attorney, Agent, or Firm*—Collard, Roe & Galgano

[57] ABSTRACT

A sealing glass composition suitable for sealing members in semiconductor devices at a temperature below about 450° C. and a comparatively low thermal expansion coefficient of about $35\text{-}50\times10^{-7}/°C$. matching that of semiconductors. The sealing glass composition comprises 50-80 vol % solder glass powder and 20-50 vol % filler powder of a ceramic comprising, by weight, PbO 65-75%, $TiO_2$ 10-25%, $Fe_2O_3$ 1-10%, $WO_3$ 1-12%, and CaO 0-5%, so that Ti in the $PbTiO_3$ filler is partially substituted by Fe and W. The filler powder has an average particle size of about 5 μm. In use of the sealing glass composition, microcracks are absent in glass phase around the filler after sealing.

4 Claims, No Drawings

SEALING GLASS COMPOSITION WITH FILLER CONTAINING FE AND W PARTIALLY SUBSTITUTED FOR TI IN PBTIO3 FILLER

BACKGROUND OF THE INVENTION

1. Field of the Invention

The present invention relates to a sealing glass composition for hermetically sealing two members and, in particular, to such a composition for use in production of electronic parts or devices such as semiconductor devices, fluorescent character display tubes, and others.

2. Description of the Prior Art

Generally speaking, the sealing glass composition is a powdery mixture comprising solder glass powder of a low melting temperature and refractory filler powder. As the solder glass, $PbO-B_2O_3$ glass has been used which consists essentially of PbO 40-90 wt % and $B_2O_3$ 8-15wt %. Another solder glass is a $PbO-ZnO-B_2O_3$ glass which consists essentially of PbO 70-85 wt %, ZnO 0.5-7 wt %, and $B_2O_3$ 7-15 wt %. These solder glasses generally have thermal expansion coefficients of about $90 \times 10^{-7}/°C$. or more which is higher than that of members of be sealed or bonded. Therefore, the filler powder is used for matching the sealing glass composition with the sealed members in the thermal expansion coefficient. Conventionally, zircon, willemite, cordierite, β-eucryptite, tin material (or tin oxide), and/or lead titanate are used as the refractory filler powder.

Among those various refractory fillers, lead titanate ($PbTiO_3$) is conveniently used, because use of a comparatively small amount of the lead titanate can provide a preferable sealing composition having a thermal expansion coefficient matching the sealed member.

However, in order to lower the thermal expansion coefficient of the sealing glass composition to match that of the sealed members, it is required to use lead titanate powder of a comparatively large particle size, for example, more than 15 μm. But use of lead titanate powder having such an increased particular size makes it difficult to deposit, by screen printing, a paste of the glass composition dissolved in a vehicle onto members to be bonded. Further, after sealing, microcracks are apt to cause in glass phase around the lead titanate crystals.

In order to provide a glass sealing composition using $PbO-TiO_2$ crystals for the filler wherein a lower thermal expansion coefficient can be realized and microcrack is not caused even if the filler has a small average particle size of, for example, 15 μm or less and is used by a small amount, U.S. Pat. No. 4,710,479 (Reference 1) issued to Yamanaka et al and assigned to Nippon Electric Glass Company, Limited discloses to use the filler which consists essentially of a lead calcium titanate represented by the following chemical formula $(Pb_{1-m}Ca_m)TiO_3$ where $0 < m \leq 0.40$.

Although the glass composition has a reduced thermal expansion and a reduced number of microcracks after sealing, a small number of microcracks is still present in the glass after sealed. This is not desirable for the sealing glass.

SUMMARY OF THE INVENTION

Therefore, it is an object of the present invention to provide a sealing glass composition which is able to form a sealed glass in which microcracks are absent.

The present invention is directed to a sealing glass composition, as used for sealing members in electronic parts consisting of a mixture which comprises solder glass powder of a low melting temperature and low expansion coefficient filler powder. According to the present invention, the filler powder mixed with the solder glass comprises a ceramic powder which consists, by weight, of PbO 65-75%, $TiO_2$ 10-25%, $Fe_2O_3$ 1-10%, $WO_3$ 1-12%, and CaO 0-5%.

In one aspect, the filler powder is 20-50 vol. % of the total amount of said composition.

The filler powder has an average particle size of about 15 μm or less and preferably about 5 μm.

Further, the mixture may further comprise at least one of zircon powder, tin material powder, β-eucryptite powder, cordierite powder, willemite powder, and mullite powder as additional filler powder for increasing mechanical strength of the sealing glass after sealed.

DESCRIPTION OF THE INVENTION

The filler used in the present invention has a reduced thermal expansion coefficient in comparison with the known $PbTiO_3$ filler of the particle size smaller than 15 μm. If PbO, $TiO_2$, $Fe_2O_3$, $WO_3$, and CaO are used over or below the amounts as described above, the thermal expansion coefficient of the filler is increased equal to or above that of the $PbTiO_3$.

The filler used in the present invention is characterized by partial substitution of Fe and W for Ti in Known $PbTiO_3$ filler or $(Pb_{1-m}Ca_m)TiO_3$ ($0 < m \leq 0.40$). This means that $TiO_2$ content in the filler is reduced in comparison with those known fillers. This is a reason why microcrack is absent in the sealing glass of the present invention after sealed, we believe. That is, the reduced amount of $TiO_2$ content results in making the sealed glass as an elastically soft material so that stress in glass surrounding the filler particles is relaxed.

EXAMPLES

Now, description will be made as to examples of the present invention.

Table 1 shows filler samples Nos. 1-5 used in glass compositions according to the present invention and a known $PbTiO_3$ of an average particle size of about 20 μm as filler sample No. 6.

TABLE 1

| | (Filler Samples) | | | | | |
|---|---|---|---|---|---|---|
| Sample No. | 1 | 2 | 3 | 4 | 5 | 6 |
| PbO | 72.5 | 71.1 | 70.1 | 69.1 | 70.5 | 73.6 |
| $TiO_2$ | 23.4 | 20.4 | 17.6 | 14.8 | 21.5 | 26.4 |
| $Fe_2O_3$ | 1.8 | 3.3 | 5.0 | 6.7 | 2.5 | — |
| $WO_3$ | 2.3 | 5.0 | 7.3 | 9.4 | 3.7 | — |
| CaO | — | — | — | — | 1.8 | — |
| | | | | | (wt. %) | |

The filler samples of Table 1 were prepared using raw materials of litharge, titanium oxide, ferric oxide (rouge), tungsten trioxide, and calcium carbonate. The raw materials were blended in proportion of each sample shown in Table 1 and were dry mixed. Then, the mixture was sintered at 1,100° C. for 4 hours. A sintered body was milled to a powder and filtrated by a screen of 350 mesh to obtain powder of an average particle size of about 5 μm.

Table 2 shows glass samples used in sealing glass composition according to the present invention.

The sample glasses listed in Table 2 were produced by using red lead, boric acid, acid, silica sand, alumina, zinc white, and lead fluoride. Those materials were weighed and mixed according to weight percent indicated in Table 2. The batch for each of sample glass was charged in a platinum crucible and was melted at 800° C. for one hour in an electric furnace. The molten glass formed into a thin glass plate. The glass plate was milled in a ball mill and then sieved through a screen of 200 mesh.

TABLE 2

| (Sample Glass) | | |
|---|---|---|
| Sample No. | 1 | 2 |
| PbO (wt. %) | 85.3 | 72.7 |
| $B_2O_3$ (wt. %) | 12.7 | 12.4 |
| $SiO_2$ (wt. %) | 1.0 | 1.0 |
| ZnO (wt. %) | — | 4.0 |
| $Al_2O_3$ (wt. %) | 1.0 | — |
| $PbF_2$ (wt. %) | — | 9.9 |
| Transition Point (°C.) | 310 | 280 |
| Deformation Point (°C.) | 330 | 300 |
| Thermal Expansion Coefficient ($\times 10^{-7}$/°C.) (30–250° C.) | 110 | 120 |

Each sample glass powder of Table 2 and each sample filler of Table 1 with or without additional filler were weighed and mixed with each other according to volume percent of example compositions listed in Table 3.

TABLE 3

| | (Examples) | | | | |
|---|---|---|---|---|---|
| Example No. | 1 | 2 | 3 | 4 | 5 |
| Filler 1 (vol. %) | 40 | — | — | — | — |
| 2 | — | 40 | — | — | — |
| 3 | — | — | 40 | 30 | — |
| 4 | — | — | — | — | 40 |
| 5 | — | — | — | — | — |
| 6 | — | — | — | — | — |
| Additional Filler (vol. %) | | | | | |
| zircon | — | — | — | — | — |
| tin material | — | — | — | — | — |
| β-eucryptite | — | — | — | — | — |
| cordierite | — | — | — | — | — |
| willemite | — | — | — | — | — |
| mullite | — | — | — | — | — |
| Glass (vol. %) 1 | 60 | 60 | 60 | 70 | 60 |
| 2 | — | — | — | — | — |
| Thermal Expansion Coefficient ($\times 10^{-7}$/°C.) (30–250° C.) | 50 | 40 | 35 | 45 | 45 |
| Sealing temperature (°C.) | 450 | 450 | 450 | 430 | 450 |
| Number of cracks (for 1 mm × 1 mm area) | 0 | 0 | 0 | 0 | 0 |
| Example No. | 6 | 7 | 8 | 9 | 10 |
| Filler 1 (vol. %) | — | — | — | — | — |
| 2 | — | — | — | — | — |
| 3 | — | 40 | 30 | 32 | 32 |
| 4 | — | — | — | — | — |
| 5 | 40 | — | — | — | — |
| 6 | — | — | — | — | — |
| Additional Filler (vol. %) | | | | | |
| zircon | — | — | — | 8 | — |
| tin material | — | — | — | — | 8 |
| β-eucryptite | — | — | — | — | — |
| cordierite | — | — | — | — | — |
| willemite | — | — | — | — | — |
| mullite | — | — | — | — | — |
| Glass (vol. %) 1 | 60 | — | — | 60 | 60 |
| 2 | — | 60 | 70 | — | — |

TABLE 3-continued

| (Examples) | | | | | |
|---|---|---|---|---|---|
| Thermal Expansion Coefficient ($\times 10^{-7}$/°C.) (30–2250° C.) | 45 | 39 | 50 | 43 | 45 |
| Sealing temperature (°C.) | 450 | 430 | 410 | 450 | 450 |
| Number of cracks (for 1 mm × 1 mm area) | 0 | 0 | 0 | 0 | 0 |
| Example No. | 11 | 12 | 13 | 14 | 15 |
| Filler 1 (vol. %) | — | — | — | — | — |
| 2 | — | — | — | — | — |
| 3 | — | 32 | 35 | 25 | 35 |
| 4 | — | — | — | — | — |
| 5 | — | — | — | — | — |
| 6 | 40 | — | — | — | — |
| Additional Filler (vol. %) | | | | | |
| zircon | — | — | — | — | — |
| tin material | — | — | — | — | — |
| β-eucryptite | — | 8 | — | — | — |
| cordierite | — | — | 5 | — | — |
| willemite | — | — | — | 15 | — |
| mullite | — | — | — | — | 5 |
| Glass (vol. %) 1 | 60 | 60 | 60 | 60 | 60 |
| 2 | — | — | — | — | — |
| Thermal Expansion Coefficient ($\times 10^{-7}$/°C.) (30–250° C.) | 45 | 41 | 40 | 48 | 45 |
| Sealing temperature (°C.) | 450 | 450 | 450 | 450 | 450 |
| Number of cracks (for 1 mm × 1 mm area) | many | 0 | 0 | 0 | 0 |

Each example composition of Nos. 1–15 in Table 3 was mixed with a suitable vehicle to form a paste. An example of the vehicle used comprises terpineol and acrylic acid resin solved therein by 5 wt %. The paste was applied, by a usual method such as screen printing, onto surfaces of bodies to be sealed and fired to seal them.

All of these examples were good in screen printing operation.

Table 3 also shows thermal expansion coefficient, sealing temperature, and number of microcracks present in a unit area for each example after sealed.

It was confirmed that the sealing temperature of each example was low and about 430°–450°C. as shown in Table 3. Further, in comparison with example No. 11, examples 1–10, 12–14 and 15 according to the present invention have comparatively low thermal expansion coefficients and are useful for sealing silicon semiconductor devices. Moreover, in the sealing glass composition according to the present invention, microcrack is absent at all in the glass after sealed, although numeral microcracks are present in the comparative example No. 11 after sealed.

For comparison, microcracks were measured for examples Nos. 1–11 in Table 3 of the Reference 1. Numbers of microcracks in examples Nos. 1–11 were 1, 3, 3, 2, 3, 3, 2, 1, 2 and 0, respectively. Although microcrack is absent in No. 11 example of Table 3 in Reference 1 after sealed, the thermal expansion coefficient is high and 68 ($\times 10^{-7}$ °C.) which is disadvantageous.

The number of microcracks was measured by counting microcracks in a unit area of 1 mm × 1 mm at various locations on a surface of each example glass after sealed under a microscope of 100 magnitude. The counted numbers for various locations in each example glass were averaged to obtain a measured result.

It will be noted from these results that the sealing glass of the present invention is advantageous in comparison with the sealing glass composition in Reference 1 in absence of microcrack.

Zircon used as an additional filler in Example 9 of Table 3 was prepared by blending zirconia (zirconium oxide), silicon powder, ferric oxide in proportion of $ZrO_2$ 66.9 wt %, $SiO_2$ 31.2 wt %, and $Fe_2O_3$ 1.9%, firing the mixture at 1,400° C. for 16 hours, milling the fired body, and sieving the milled powder through a screen of 350 mesh. The zirconia used herein was previously prepared by removing radioactive impurities such as U and Th contents from natural zirconia to reduce alpha radiation. The U and Th removing method is disclosed in U.S. Pat. No. 4,774,208 (Reference 2) issued to Yamanaka et al and assigned to Nippon Electric Glass Company, Limited.

Tin material used in Example No. 10 of Table 3 was prepared by mixing tin oxide and zinc white in proportion of $SnO_2$ 99.0 wt % and ZnO 1.0 wt %, firing the mixture at 1,450° C. for 16 hours, milling the fired body, and sieving the milled powder through a screen of 350 mesh.

B-eucryptite used in example No. 12 of Table 3 was prepared by mixing lithium carbonate, alumina, and silicon powder to form $Li_2O\ Al_2O_3\ 2SiO_2$, firing the mixture at 1,250° C. for 5 hours, milling the fired body, and filtrating the milled powder through a screen of 250 mesh.

Cordierite used in example No. 13 of Table 3 was prepared by mixing magnesia, alumina, and silicon powder to form $2MgO\ 2Al_2O_3\ 5SiO_2$, melting the mixture in platinum crucible at 1,580° C. for four hours to form a thin glass plate, milling the glass plate into a powder sieved through a screen of 150 mesh, and heating the powder at 1,000° C. for 12 hours to form cordierite.

Willemite used in Example 14 of Table 3 was prepared by mixing zinc white and silicon powder to form $2ZnO\ SiO_2$, firing the mixture at 1,400° C. for 16 hours, milling the fired body, and sieving the milled body through a screen of 250 mesh.

Mullite used in example 15 of Table 3 was prepared by mixing kaolin, alumina, and magnesia in proportion of $Al_2O_3$ 71.1 wt %, $SiO_2$ 27.9 wt %, and MgO 1.0 wt %, firing the mixture at 1,700° C. for 16 hours, milling the fired body, and sieving the milled powder through a screen of 150 mesh.

What is claimed is:

1. In a sealing glass composition, as used for sealing members in electronic parts, consisting of a mixture which comprises solder glass powder of a low melting temperature and low expansion coefficient filler powder, the improvement wherein said filler powder comprises a ceramic powder which consists, by weight, of PbO 65-75 %, $TiO_2$ 10-25%, $Fe_2O_3$ 1-10%, $WO_3$ 1-12%, and CaO 0-5%.

2. A sealing glass composition as claimed in claim 1, wherein said filler powder is 20-50 vol. % of the total amount of said composition.

3. A sealing glass powder as claimed in claim 1, wherein said filler powder has an average particle size of about 5 $\mu$m.

4. A sealing glass composition as claimed in claim 1, wherein said mixture further comprises at least one of zircon powder, tin material powder, B-eucryptite powder, cordierite powder, willemite powder, an d mullite powder as additional filler powder.

* * * * *